United States Patent [19]

Maixner et al.

[11] 4,241,451
[45] Dec. 23, 1980

[54] SINGLE SIDEBAND SIGNAL DEMODULATOR

[75] Inventors: Richard C. Maixner, Dallas; Robert K. Marston, Plano; Khalil E. Massad, Garland, all of Tex.

[73] Assignee: Rockwell International Corporation, El Segundo, Calif.

[21] Appl. No.: 919,021

[22] Filed: Jun. 26, 1978

[51] Int. Cl.³ .............................................. H04B 1/26
[52] U.S. Cl. .................................. 455/202; 329/145; 455/46
[58] Field of Search .................. 325/330, 50, 449; 329/50, 145; 328/133, 37, 55; 331/2; 455/47, 203, 46, 202

[56] References Cited

U.S. PATENT DOCUMENTS

| | | | |
|---|---|---|---|
| 3,863,174 | 1/1975 | Klinger | 331/2 |
| 4,035,732 | 7/1977 | Lohrmann | 325/449 |
| 4,057,762 | 11/1979 | Namiki | 329/50 |

OTHER PUBLICATIONS

Pappenfus et al., "SSB Principles and Circuits"; McGraw-Hill Co. 1964, pp. 305-307.
Turin, "An Introduction to Digital Filters"; Proc; of IEEE, vol. 64, No. 7, Jul. 1976, pp. 1092-1097.
McBride, "On Optimum Sampled Data FM Demodulation"; IEEE; Transactions on Communications, vol. Com-21 No. 1, Jan. 1973, pp. 40-50.
Taub et al., "Principles of Communication Systems", McGraw-Hill Co. 1971, p. 161.
Bjerede et al., "Digital Processing Receiver", bulletin AD-A008 522-National-Technical Information Service, Dept. of Commerce.

*Primary Examiner*—Marc E. Bookbinder
*Attorney, Agent, or Firm*—Richard K. Robinson; Howard R. Greenberg; H. Frederick Hamann

[57] ABSTRACT

A single sideband signal can be demodulated by using sampled data techniques. An intermediate frequency (IF) radio signal is split into two branches and is sampled by two sample and hold devices; each sample and hold device operates at a rate that is not only a submultiple of the carrier frequency, but is also at least twice the information bandwidth. Prior to, or during sampling of one branch (the quadrature branch), a Hilbert's transform is performed upon the IF signal which results in the output of the two sample and hold devices being in phase quadrature. A phase shift of 90°, using a baseband finite impulse response Hilbert's transform filter, is performed upon the output signal of the quadrature branch's sample and hold device. The sum of the in-phase sampled signal and the filtered quadrature phase sampled signal produces the demodulated lower sideband while the difference between the two produces the demodulated upper sideband. There are two basic examples shown of single sideband demodulation through the use of sampled data techniques; in addition, there are several examples of implementing the Hilbert's Transformer.

13 Claims, 8 Drawing Figures

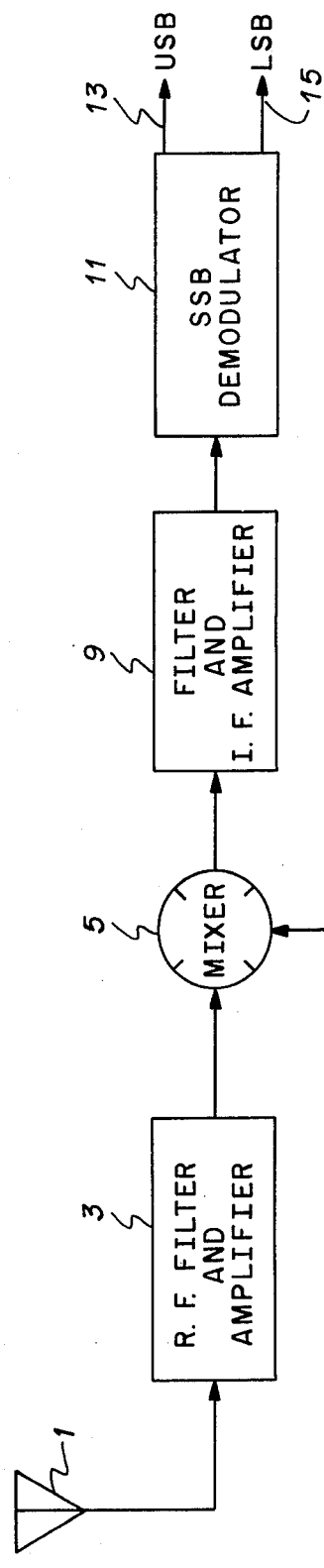
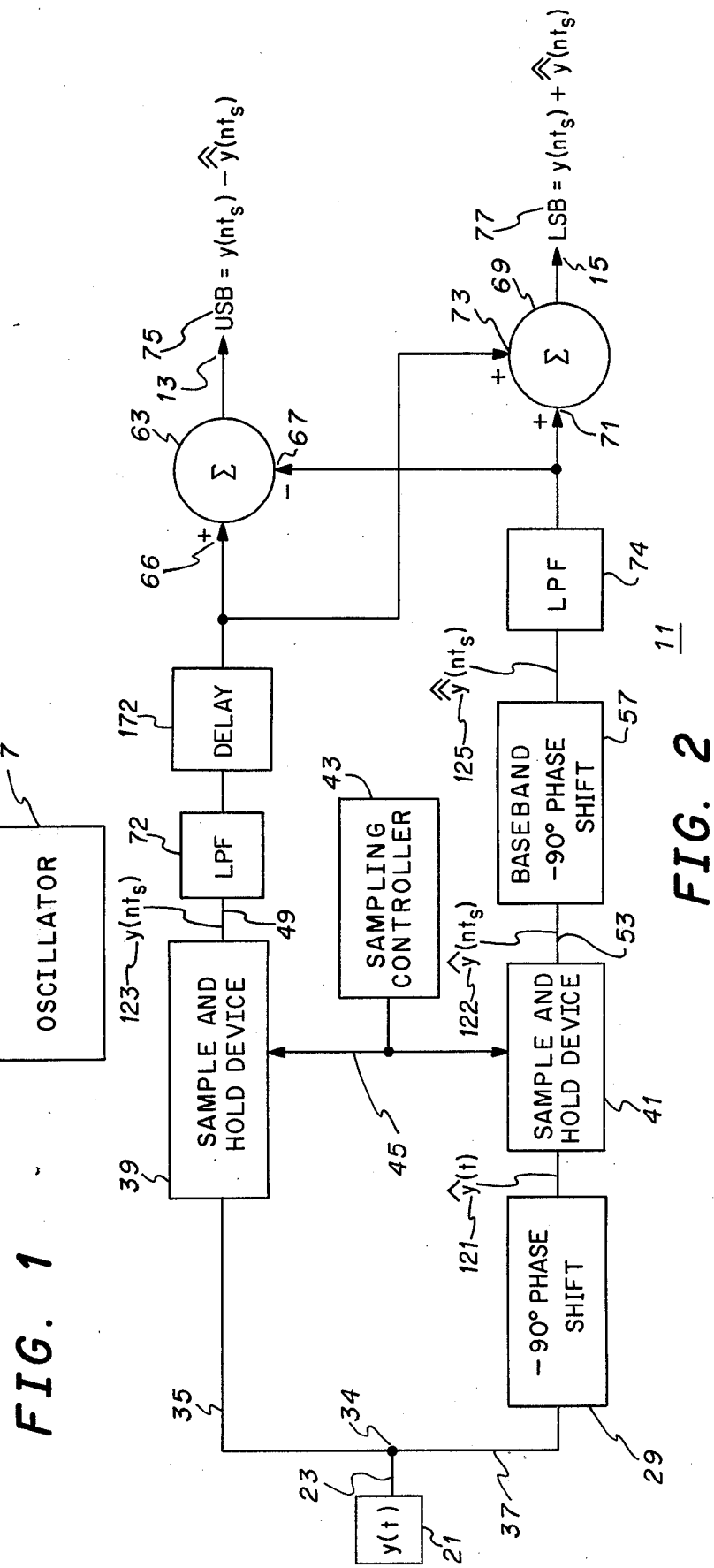

SINGLE SIDEBAND SIGNAL DEMODULATOR

The Government has rights in this invention pursuant to Contract No. DAHC15-73-C-0192 awarded by the Department of the Army.

BRIEF DESCRIPTION OF THE PRIOR ART AND SUMMARY OF THE INVENTION

This invention relates to a method and apparatus used for single sideband demodulation.

There have traditionally been two general methods of single sideband demodulation. One method, being the basic filter method, consists of mixing a radio frequency (RF) signal with a local oscillator (LO) frequency. The translated intermediated frequency (IF) that results from the mixing stage is then split into two branches, an upper sideband branch and a lower sideband branch. Each branch is then filtered by extremely narrow filters that generally are the precision type filters, such as those obtained with crystal or ceramic devices. After the filtering process has been accomplished, demodulation is completed by adding the carrier frequency to the filtered output signals and the upper and lower sidebands are separated by using an amplitude modulation (AM) detector.

Another method is the phase detection method for demodulating single sideband (SSB) and it consists of first mixing the incoming RF signal with an LO signal. Downconverting to baseband is achieved by splitting the IF output of the first mixing stage into two branches and then mixing one branch with an inphase carrier frequency and the other branch with a phase quadrature of the carrier frequency. The branch that was mixed with the quadrature carrier frequency is applied to a phase shift network that produces another 90° phase shift and it is summed with the signal that was mixed with the inphase carrier frequency to produce the upper sideband signal. The difference between the two produces the lower sideband signal. In both cases described above, the single sideband demodulation is performed through analog means rather than digital or sampled data means.

Since the advent of large scale integration (LSI) digital circuits, charge-coupled devices, and the low cost associated with these circuits, there has been great interest in developing an all digital or sampled data radio receiver. The major limitation barring the realization of the all digital or sampled data receiver is the requirement for ultra high speed digital logic and phase sampling switches. These requirements become more stringent as sampled data designs are forced into very wide bandwidths and high IF frequencies that are required for modern receivers.

One of the major advances in the design of sampled data receivers was disclosed in an article published in *IEEE Transactions on Communications*, Vol. Com.—21, No. 1, on January, 1973, by Alan L. McBride and entitled "An Optimum Sampled-Data FM Demodulator". This article disclosed a synthesized recursive algorithm that can be implemented as a digitalized or sampled data (FM) modulator/demodulator. Although this article discloses means and methods of demodulating FM signals using modern sampled data techniques, there has been very little success in applying sampled data techniques to amplitude modulated signals and especially to single sideband signal demodulation.

A single sideband signal can be demodulated by using sampled data techniques. An intermediate frequency (IF) radio signal is split into two branches and is sampled by two sample and hold devices; each sample and hold device operates at a rate that is not only a submultiple of the carrier frequency, but is also at least twice the information bandwidth. Prior to or during sampling of one branch (the quadrature branch), a Hilbert's transform is performed upon the IF signal which results in the output of the two sample and hold devices being in phase quadrature. A phase shift of 90°, using a baseband finite impulse response to Hilbert's transform filter, is performed upon the output signal of the quadrature branch's sample and hold device. The sum of the inphase sampled signal and the filtered quadrature phase sampled signal produces the demodulated lower sideband while the difference between the two produces the demodulated upper sideband.

There are essentially three methods and apparatuses disclosed for implementing the IF Hilbert's transform. The first method and apparatus consists of applying the IF signal to a commercially available hybrid quadrature coupler, which essentially consists of a means of both inductively and capacitively coupling an electrical signal across two ports. The physical apparatus, for microwave frequencies, comprises a pair of conductive printed lines in close proximity to each other that are pressed between two common ground plates. Each coupler is designed to be used for a specific frequency range so that both the proper inductive and capacitive coupling can be achieved. The second method utilizes a delay line that is placed in the quadrature branch and provides a tuned delay that corresponds to ¼ of a carrier cycle. This ¼ carrier cycle produces a quadrature phase shift of the carrier baseband. The third method consists of generating two sampling command signals. One signal is selected to pulse the first sample and hold device at a frequency that is a submultiple of the carrier frequency. A second signal pulses the second sample and hold device at the same frequency as the first signal; however, there is a phase delay between the two signals that corresponds to a 90° phase shift of the carrier frequency and this results in the donwconverted output of the two sample and hold devices being in phase quadrature with each other. It is immaterial if either the inphase sampling command (or pulse) is advanced to occur prior to the quadrature sampling command or the quadrature sampling command is delayed to occur after the inphase sampling command.

The Hilbert's Transformer, as referred to above, refers to performing a phase shift upon a signal without having distorted the amplitude of the signal. In the application of a single sideband demodulator, the Hilbert's Transformer is used to implement a 90° phase shift. For baseband frequencies or audio ranges, there is a wide range of methods and devices available for implementing the Hilbert's Transform network. One method is to use an analog series to parallel signal converter, such as a charge coupled device (CCD) or charge transfer device (CTD). In this case, the output of the CCD is summed by a summing amplifier and applied to a summer for processing of the upper and the lower sidebands. Another method would be to use one of the different analog devices and methods, such as operational amplifiers, in a finite impulse response configuration having the sampled data signal fed into it. A third method is to digitize the output of the sample and hold device and use a digital method of implementing a 90° phase shift, such as a shift register with the weighted outputs applied to a summing junction or a microprocessor.

In all of the above-listed cases, modern LSI devices were used to implement sampled data demodulation of single sideband signals. This and many other objects and purposes of the invention will be clear from the following detailed description of the drawings.

BRIEF DESCRIPTION OF THE DRAWINGS

FIG. 1 is a block diagram of a single sideband receiver, made in accordance with this invention;

FIG. 2 is an embodiment of the single sideband demodulator of FIG. 1;

DETAILED DESCRIPTION OF THE INVENTION

Figure 3:
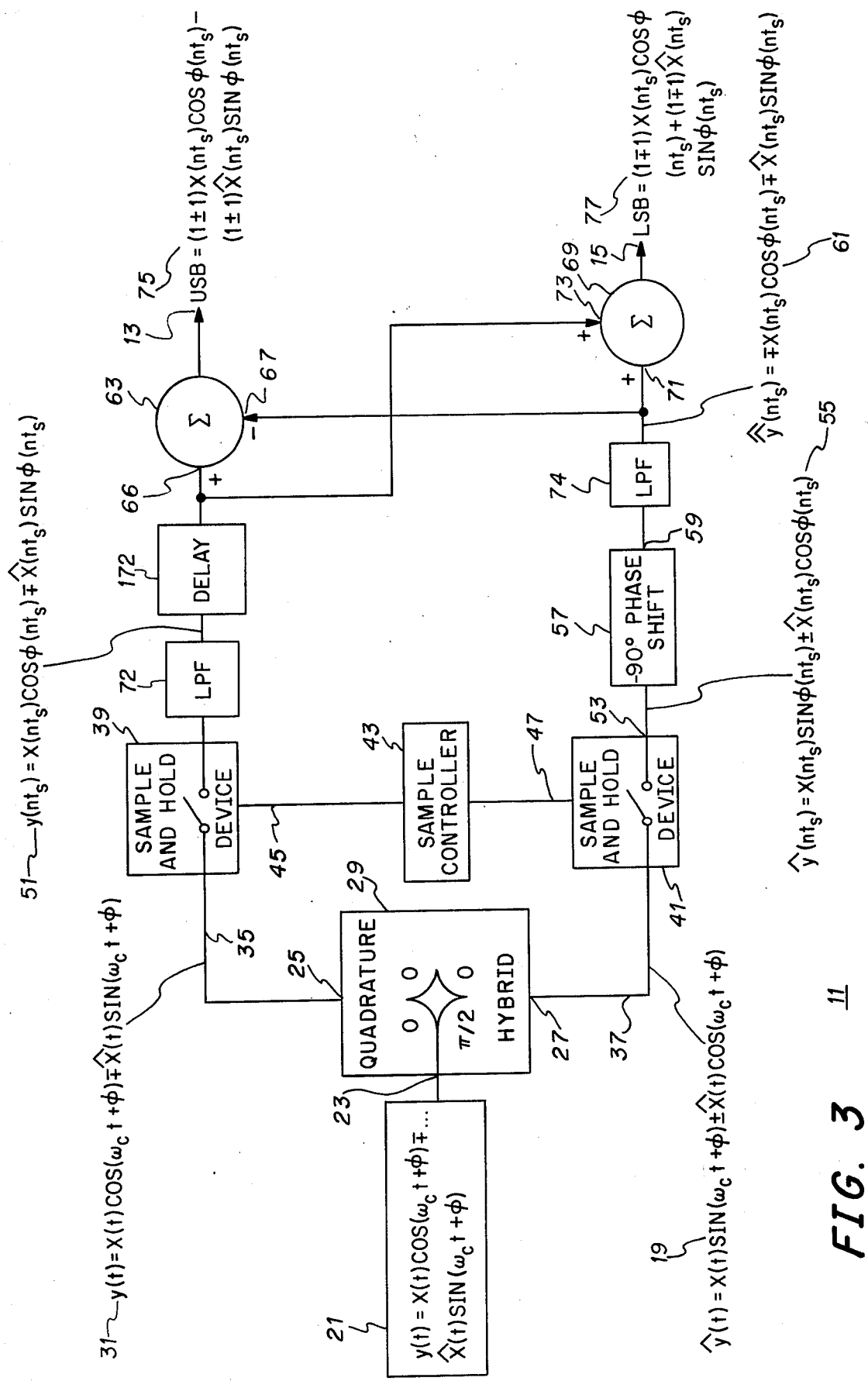
FIG. 3 is a block diagram of another embodiment of a single sideband demodulator that is made in accordance with this invention.

Generally, the function of a single sideband receiver is to amplify, select, adjust the level of, and demodulate the received signal. The block diagram that represents the implementation of these functions is shown in FIG. 1. The RF filter and amplifier 3 provide the filtering and amplification necessary to yield a good signal-to-noise ratio of the signal that is detected by antenna 1 and also necessary and sufficient enough to override the noise of the mixer 5. The mixer 5 translates to IF the frequency of the signal that is to be demodulated by multiplying the selected LO frequency that is generated by the local oscillator 7 with the output of the RF filter and amplifier. This resulting intermediate frequency is then filtered and amplified by IF filter and amplifier 9 and applied to the single sideband demodulator 11 which provides the demodulated upper sideband signal at terminal 13 and the demodulated lower sideband signal at terminal 15.

FIG. 2 is a block diagram of a demodulator that separates the upper and lower sidebands from a signal represented by Y(t) located generally at 21. The demodulated upper sideband signal 75 appears at terminal 13 and the demodulated lower sideband signal 77 appears at terminal 15. The process in which demodulator is accomplished provides for splitting Y(t) into two parallel branches, 35 and 37. Branch 35 is the inphase branch and is connected to sample and hold device 39 for downconverting to baseband frequency in response to a sampling controller 43 which provides a string of periodic pulses on conductor 45. During the occurrence of each pulse, the signal that is present on branch 35 is conveyed to conductor 49 and by the operation of the sample and hold device, Y(t) is converted to Y(nt$_s$), where n is an integer variable and t$_s$ is the sampling period. Branch 37 is the quadrature branch and has a means for implementing a Hilbert's transform, such as a delay line of $\frac{1}{4}$ cycle of the carrier frequency, whereby the output $\hat{Y}$(t) located at 121 of the Hilbert's Transformer 29 is in phase quadrature with Y(t). A Hilbert's transform is the process of implementing a 90° phase shift of a signal with only a minimum of amplitude distortion.

After the Hilbert's Transformer 29, the signal, or more accurately, the quadrature signal $\hat{Y}$(t), is applied to sample and hold device 41 where the sampling controller 43 also provides a string of periodic pulses through conductor 45 converting $\hat{Y}$(t) to $\hat{Y}$(nt$_s$), as indicated at 122.

The pulses on the conductor 45 have a period t$_s$ that meets the requirement of being a submultiple, within a specified tolerance of the carrier frequency's period and equal to or greater than two times the message bandwidth. The outputs, Y(nt$_s$) and $\hat{Y}$(nt$_s$), of both sample and hold devices 39 and 41 are baseband signals that resulted from downconverting by the sampling network.

The quadrature sample and hold device's output is applied to a $-90°$ phase shift network or baseband Hilbert's Transformer 57 which converts $\hat{Y}$(nt$_s$) to $\hat{\hat{Y}}$(nt$_s$) as indicated at 125.

Low pass filter means 72 and 74 are provided to remove any high frequency noise (noise that is of a frequency greater than signal bandwidth frequencies). Such noise is often generated by the operation of a sample and hold device.

To provide summing of the inphase and quadrature phase signals, the output of the baseband Hilbert's Transformer 57 is applied to the summing point 71 of the quadrature summer 69 and to the difference junction 67 of the inphase summer 63. The output 49 of the inphase sample and hold device 39 is applied, after correcting for the differential time delay between the inphase branch and the quadrature branch by delay means 172 to the summing point 66 of summer 63 and summing point 73 of summer 69. The difference of the signals that are present on terminals 66 and 67 is taken and the demodulated upper sideband signal 75 is present at terminal 13. In the case of the lower sideband 77, the sum of the signals on terminals 71 and 73 is taken by summer 69 and the demodulated lower sideband signal appears at terminal 15.

Time delay device 172 is for correction of any differential time delay between the inphase branch and the quadrature branch. The need to correct for time delays results from the time requirements necessary to implement the 90° phase shift with a circuit such as a Hilbert's Transformers.

Another embodiment of the demodulator 11 of FIG. 1 is provided in FIG. 3, along with a brief mathematical analysis of the demodulation process. An input signal 21 having the mathematical equation $Y(t) = X(t) \cos(\omega_c t + \phi) \mp \hat{X}(t) \sin(\omega_c t + \phi)$ is applied to the input of a quadrature hybrid coupler 29. $\omega_c$ is the carrier frequency in radians/seconds and $\phi$ is a constant phase shift.

The quadrature hybrid coupler 29 is a commercial means of implementing the intermediate frequency (IF) 90° phase shift or Hilbert's Transform on the incoming signal and is generally commercially available if the IF is in the megahertz range. Quadrature hybrid coupler 29, when used for VHF and higher frequencies, consists essentially of a pair of printed lines in close proximity sandwiched between two common ground planes. The length of the lines is very small when compared to the wavelength of the signal that is applied across them, and is generally represented as a pair of wire loops whose extremities are terminated in a resistive load such as 50 ohms to ground. Because of the proximity, the loops are coupled both inductively and capacitively. This results in the ability of the quadrature hybrid to perform the 90° phase shift upon an input signal applied across one loop in relation to the signal that appears across the other loop.

Referring to FIG. 3, the inphase signal that appears on the output of the quadrature hybrid coupler 29 at terminal 25 is connected to branch 35 and can generally be represented by the equation Y(t) as it appears at 31. The quadrature output that appears at port 27 is connected to the quadrature branch 37 and has a form of equation at 19.

The sampling controller 43 provides the sampling pulses through conductor means 45 and 47 to both the inphase's sample and hold device and the quadrature phase's sample and hold devices 39 and 41, respectively. For the inphase sample and hold device 39, the sample pulses occur at $nt_s$. The carrier frequency $\omega_C$ can be represented as $\omega_C = (2\pi K f_s \pm \omega_d)$ with K = any integer and $\omega_d$ can be referred to as the doppler frequency, or offset frequency. Because K is any integer, the sampling rate must be a submultiple of the carrier frequency. The equation for the downconverted signal that is the output of sample and hold device 39 is provided at 51. The output 49 of the sample and hold device 39, after passing through low pass filter means 72, is connected to a time delay element 172 and then to summer means 63 at summing point 66, and also to summer means 69 at summing point 73.

The signal present on the quadrature branch 37 is represented by the equation at 19. This signal is applied to the quadrature branch's sample and hold device 41. The output signal that appears at port 53 of the sample and hold device has the form generally represented by the equation at 55, that is, $\hat{Y}(nt_s) = X(nt_s) \sin \phi(nt_s) \mp X(nt_s) \cos \phi(nt_s)$. Port 53 of the sample and hold device is connected to the 90° phase shift network 57, which is the baseband Hilbert's Transformer. The signal that appears on the output terminal 59 of the Hilbert's Transformer 57, after passing through the low pass filter means 74, is represented by the equation 61 and is applied to the summing point 71 of summer 69 and the difference point 67 of summer 63. As was the case with FIG. 2, the demodulated upper sideband signal 75 appears on terminal 13 and the lower sideband signal 77 appears on terminal 15.

Figure 4:
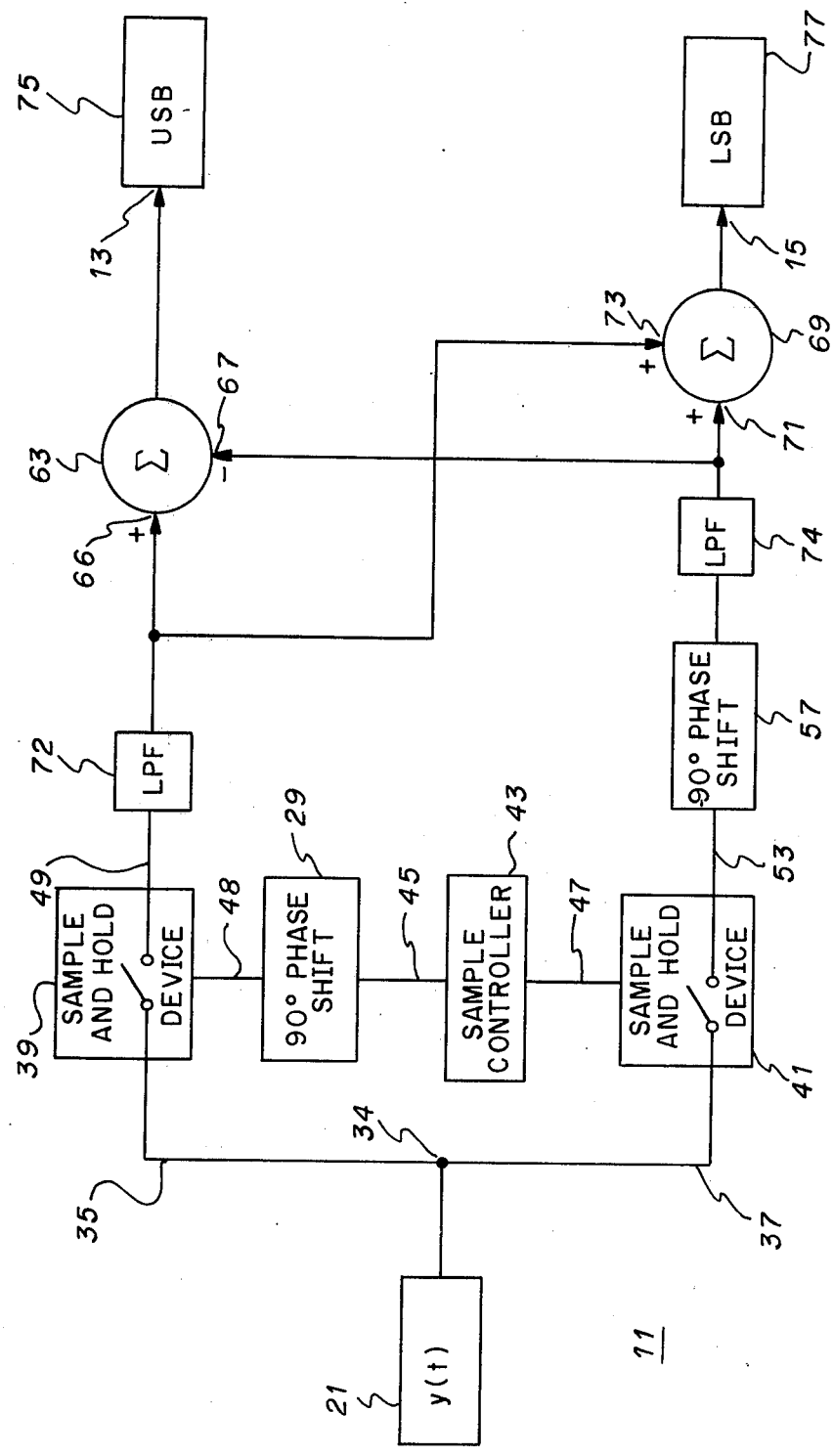
FIG. 4 is a block diagram of yet another embodiment of a single sideband demodulator made in accordance with this invention.

FIG. 4 is another embodiment of the demodulator 11 of FIG. 1 in which the separation of the inphase branch 35 and the quadrature phase branch 37 is accomplished simultaneously with downconverting through the controlling of the sample and hold devices 39 and 41. In general, if an incoming signal having a carrier frequency of $\omega_c$ was sampled at a rate of $1/t_s$, where $1/t_s$ was a submultiple of the carrier frequency (that is, $2\pi f_c = 2\pi K/t_s$ where K is any integer) and a second branch of the same signal was sampled at the same rate, but delayed by $1/(4f_c)$ seconds, then the baseband signal that appears on the output of the two sampling devices are in phase quadrature with each other. For example, referring to FIG. 4, sampling controller 43 provides output pulses on conductors 45 and 47 which are inphase. Phase shift device 29 provides a 90° phase shift to the pulses so that the pulses, $t_s$, that control the sample and hold device 39 are related to the pulse, $\hat{t}_s$, that control the sample and hold device 41 by the equation, $$\hat{t}_s = t_s + \frac{1}{(4f_c)}.$$

The resulting downconverted signal at port 49 is represented by equation 51 of FIG. 3 and the quadrature branch's sample and hold device 41 provides a signal at port 53 that can be represented by equation 55 of FIG. 3. The remainder of the circuits from ports 49 and 53, for both FIGS. 3 and 4, can be identical.

Figure 5:
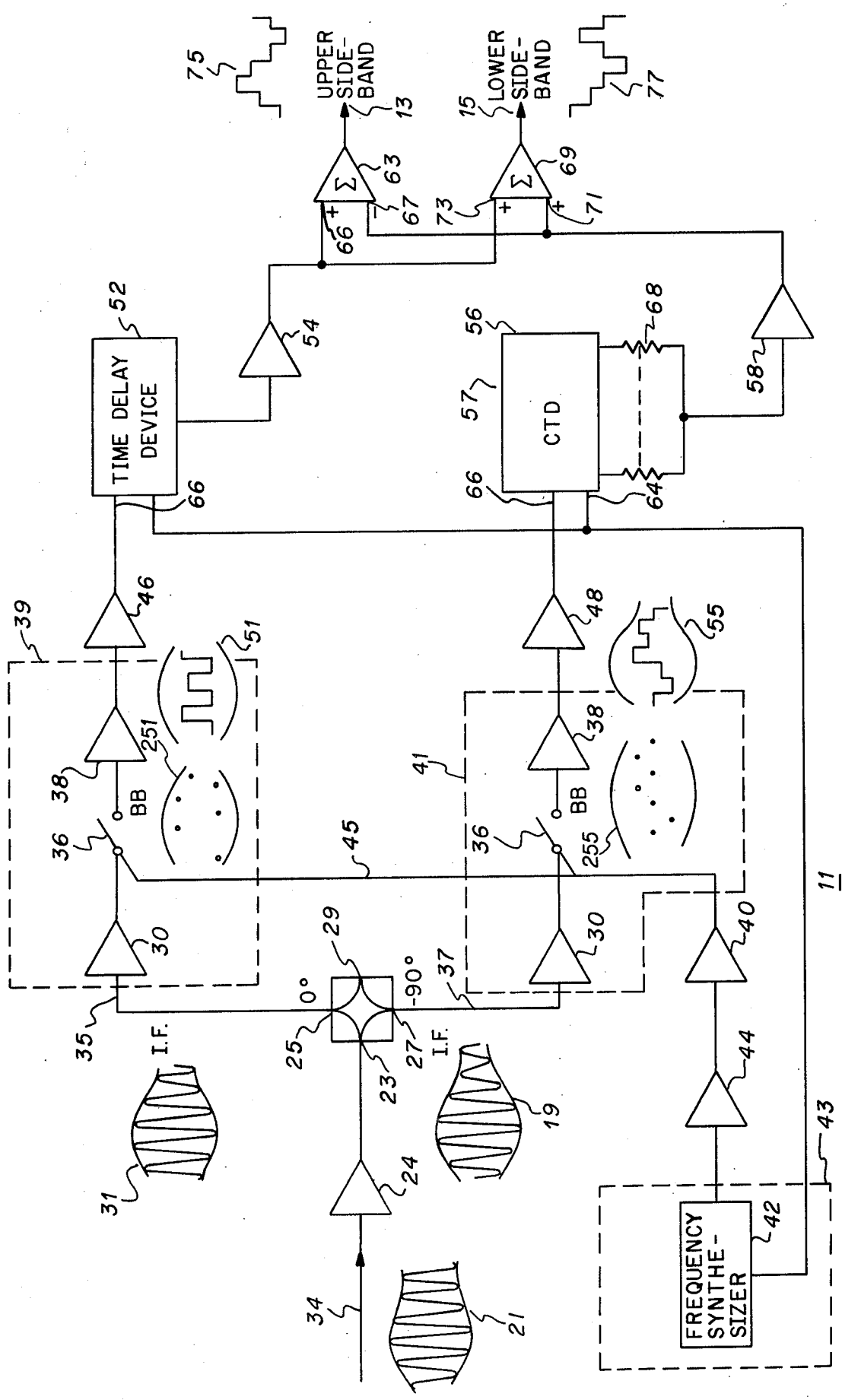
FIG. 5 is a schematic diagram of the single sideband demodulator of FIG. 3.

FIG. 5 is a circuit diagram of the sampled data single sideband demodulator 11. An input signal having the waveform represented by 21 is applied to input 34. There is an interface buffer 24 located between the source of signal 21 and the quadrature hybrid 29. The output of the buffer 24 is applied to input port 23 of the quadrature hybrid 29, which functions as a Hilbert's Transformer, and thus, the waveform that appears on branch 35 and represented by waveform 31 is in phase quadrature with the signal that appears on the quadrature branch 37 that is represented by waveform 19. Both the inphase's sample and hold device 39 and the quadrature phase's sample and hold device 41 consist of, in cascade arrangement, a sample and hold buffer 30 which is connected to a sample and hold switch 36. There is also a sample and hold output amplifier 38 which includes an energy storage device, such as a capacitor (not shown).

The sampling controller 43 consists of a frequency synthesizer 42 which is connected to a switch driver amplifier 40 by means of an Emitter Couple Logic (ECL) interface circuit 44. The switch driver, of course, provides pulses with capacity enough to drive the switch means 36. The output of the switch driver is applied to the switch means 36 by conductor 45.

Waveforms 251 and 255 are the inphase and quadrature phase samples of the input signal represented by waveforms 31 and 19, respectively. The outputs of the inphase and quadrature phase sample and hold amplifiers 38 are shown by waveforms 51 and 55.

The Hilbert's Transformer 57 consists of an input buffer and driver 48, a charge transfer device 56 (CTD) or a CCD, a plurality of summing resistors 68 which functions as a weighted coefficient network, and an output buffer 58. The CTD has a plurality of individual storage cells located therein and performs a series to parallel conversion. That is, the charge transfer device, or charge couple device, is essentially an analog shift register and, upon the occurrence of a clock pulse at terminal 64, the amplitude of the data on terminal 66 is loaded into the CTD and is shifted across the charge transfer device appearing at the appropriate output terminal upon the occurrence of each clock pulse. The output of the CTD is fed into a weighted coefficient network 68 which, in conjunction with the buffer amplifier 58, acts as a summing amplifier and the overall result is the implementation of a Hilbert's Transformer.

Because of the delay in signals encountered by implementing the Hilbert's Transformer 57, there is present in the inphase line 35 a time delay device 52 which is essentially a charge couple device used as an analog shift register, and insures the proper quadrature phase relationship between the two signals that are present on the output of buffer 54 and buffer 58.

The summer circuit consists of a summer amplifier 69, which is used to decode the lower sideband and a difference amplifier 63, which is used to decode the upper sideband. The upper sideband appears at terminal 13 and is represented by waveform 75. The lower sideband signal appears at terminal 15 and is represented by waveform 77.

In general, the incoming IF signal that is applied to the single sideband demodulator 11 is sampled by sampling frequency of F produced by sampling controller 43 and has a sampling time window $T_w$. $T_w$ becomes even more critical when sampling IF frequencies at frequencies greater than 10 MHz. In the single sideband demodulator shown in FIG. 5, an adequately short sample time window is achieved if $T_w \leq 1/(50F_c)$.

The selection of the switching circuits available were found to include transfer electron devices (TED) with 14 GHz switching speed and GaAs MESFETS that provide up to 4 GHz switching speed.

It was also determined that the Hilbert's Transformer 57 could be made from either microprocessors, CTD's or CCD's. Microprocessors exist with processing speeds of about one microsecond/ADD instructions. (Operational CCD shift registers, filters, and correlators are available with a maximum clocking speed of 5 MHz.) Implementing these devices in FIGS. 5 and 6, a single sideband demodulator was developed for a receiver having a carrier frequency $F_c \leq 110$ MHz and a bandwidth $\leq 7.5$ KHz. However, it has been determined that the bandwidth can be extended beyond 14 MHz, the only limitation being the clocking speeds of the switches and CCD's.

Figure 6:
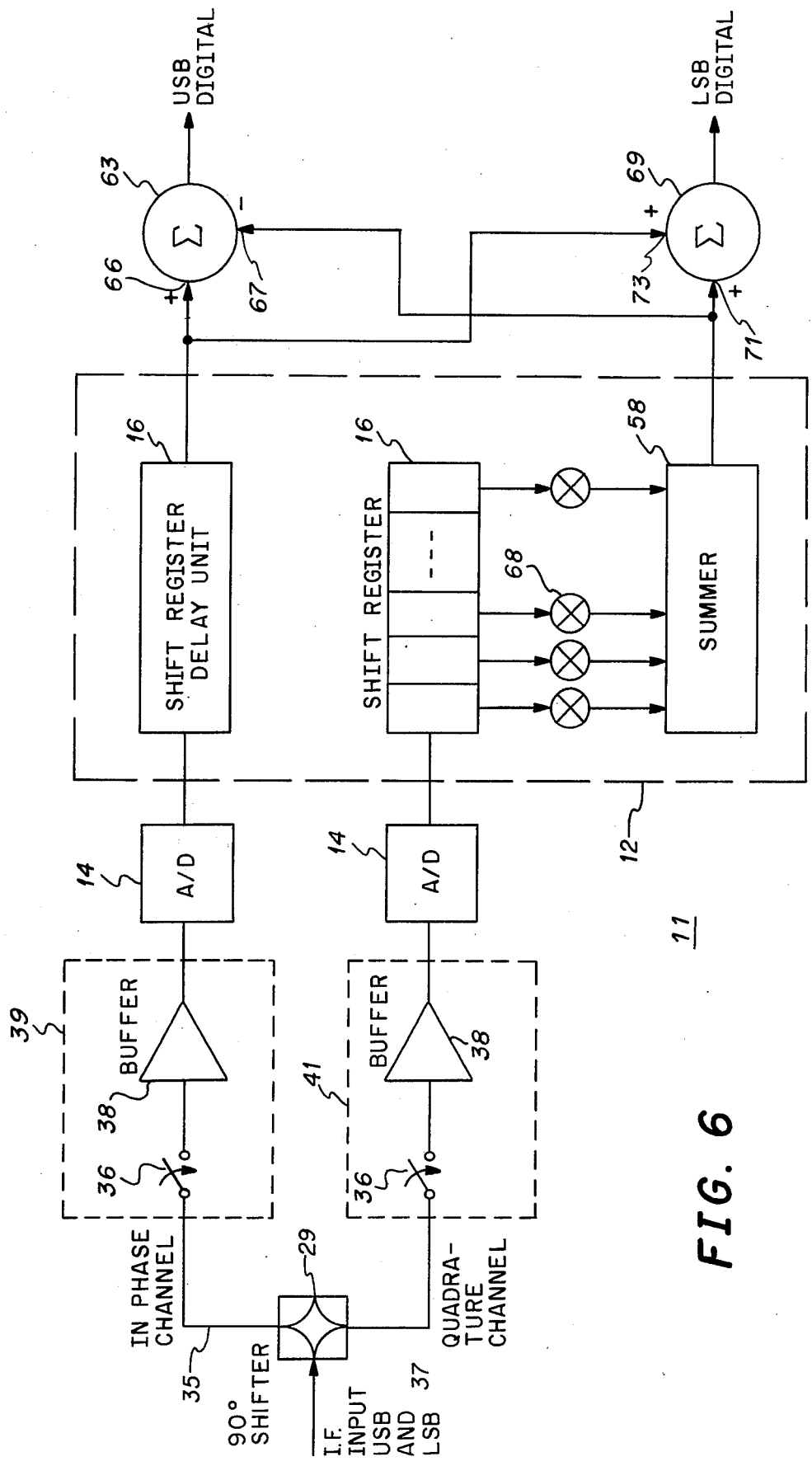
FIG. 6 is a schematic diagram of a single sideband demodulator using a digitalized Hilbert's Transformer.

In FIG. 6, the outputs of the sample and hold buffers of both the inphase and the quadrature phase branches are applied to the inputs of analog to digital converters (A/D) 14. The digital information that appears on the output of the analog to digital converter 14 in the quadrature phase is clocked into a digital shift register in a similar manner as that shown in FIG. 5. The outputs of the shift register are connected to the weighting network 68 which is connected to the input of summing network 58. As in the case with FIG. 5, it is necessary to provide a time delay for the inphase branch; therefore, a shift register 16 is placed between the output of the inphase A/D 14 and the summing amplifiers 63 and 69.

Another embodiment of the invention would be to replace the baseband processor 12 with a microprocessor which would perform the Hilbert's transform on the quadrature phase line and provide the sum and difference outputs between the inphase and quadrature phase branches.

Figure 7:
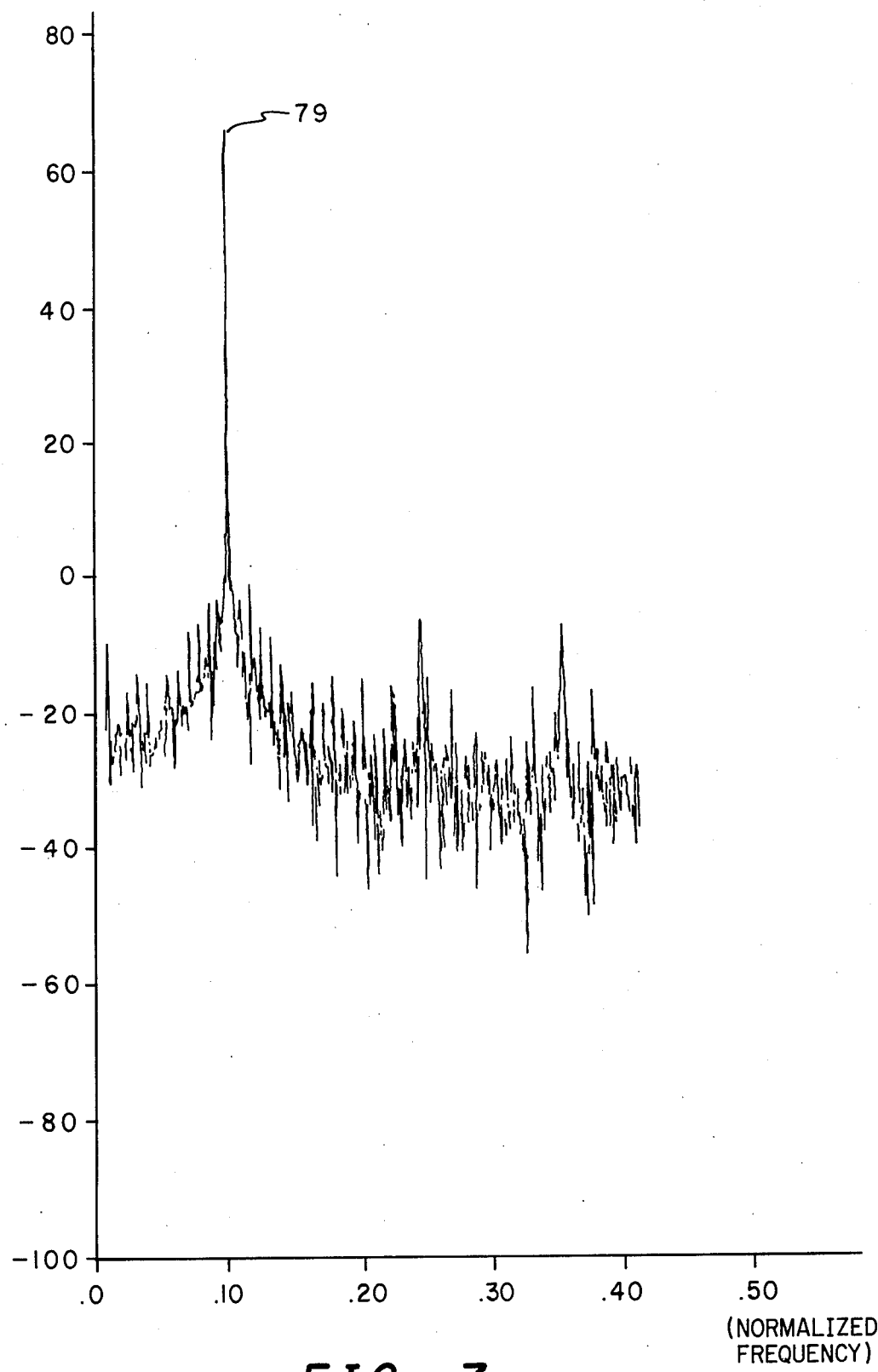
FIG. 7 is a spectrum diagram of the baseband upper sideband output signal of the demodulator.
Figure 8:
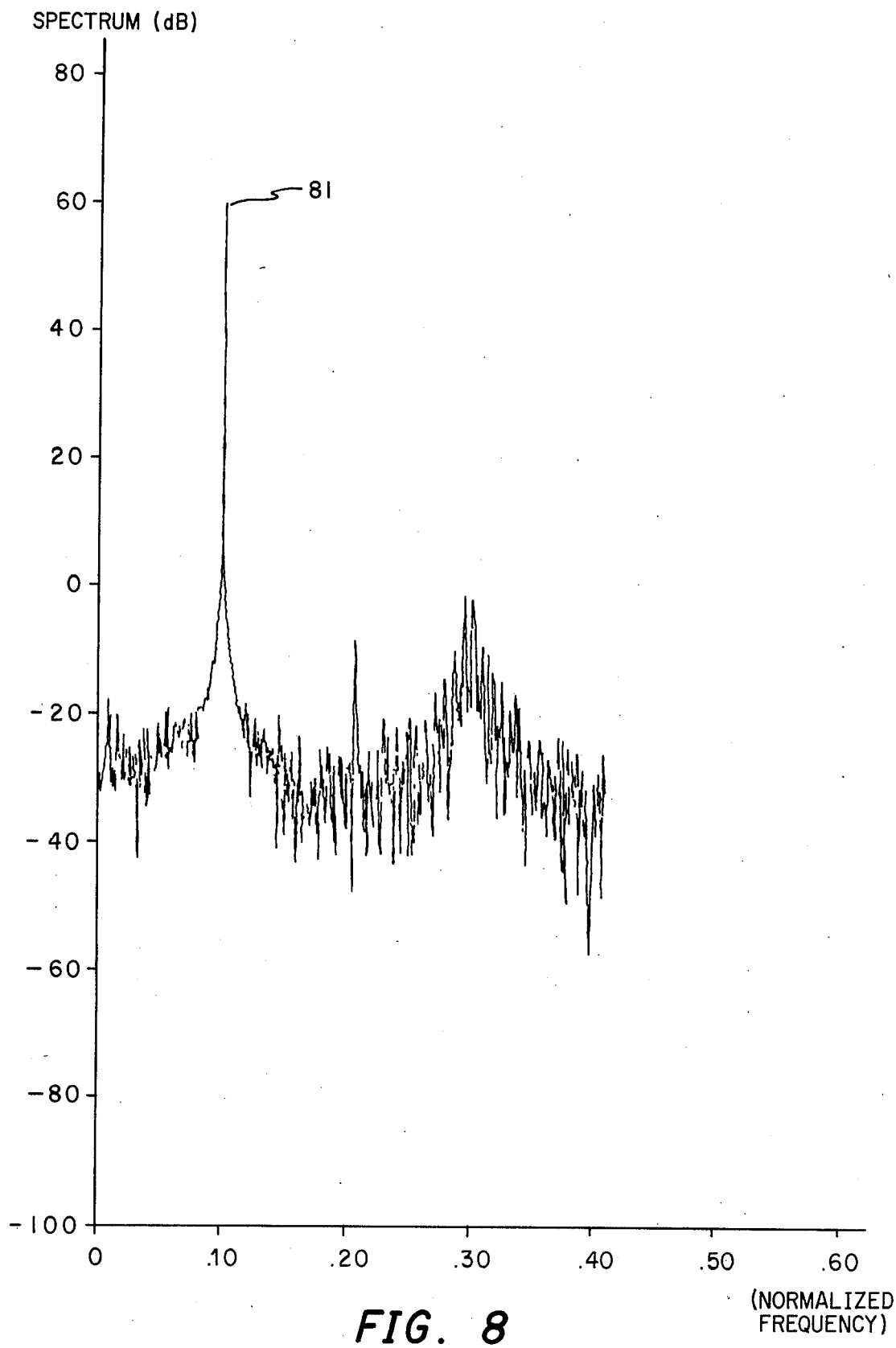
FIG. 8 is a spectrum diagram of the baseband lower sideband output signal of the demodulator.

If a double sideband signal is applied to terminal 23, the performance of the demodulator 11 of FIG. 5 is shown in FIGS. 7 and 8, in which the ordinate represents frequency in hertz, as normalized with respect to the sampling frequency, and the abscissa represents the spectrum of the response of the demodulator in dB. As can be seen from FIG. 7, peak 79 represents the upper sideband output of the demodulator 11 as seen from terminal 13, and curve 81 of FIG. 8 represents the lower sideband output of the demodulator 11 as seen from terminal 15.

Many modifications in the above-described embodiments of the invention can, of course, be carried out without departing from the spirit and scope of the invention. Accordingly, the invention is intended to be circumscribed only by the scope of the appended claims.

What is claimed is:

1. A demodulator for demodulating a received signal that can be represented by the equation $Y(t)=X(t) \cos(\omega_c t + \phi) \pm \hat{X}(t) \sin(\omega_c t + \phi)$ where $\omega_c$ is the carrier frequency and $\phi$ is a constant phase shift, comprising:
   means for converting the received signal y(t) into a first baseband signal $Y(nt_s)$ where n is an integer variable and $t_s$ is a sampling period;
   means for converting the received signal Y(t) into a second baseband signal $\hat{Y}(nt_s)$; where n is an integer variable and $t_s$ is a sampling period;
   means for performing a Hilbert's transform on the second baseband signal $\hat{Y}(nt_s)$ to obtain a quadrature second baseband signal $\hat{Y}(nt_s)$;
   means for adding the first baseband signal $Y(nt_s)$ to the quadrature second baseband signal $\hat{Y}(nt_s)$ to obtain a lower sideband signal; and
   means for subtracting the quadrature second baseband signal $\hat{Y}(nt_s)$ from the first baseband signal $Y(nt_s)$ to obtain an upper sideband signal.

2. The demodulator according to claim 1 wherein the means for converting the received signal Y(t) into a second baseband signal $\hat{Y}(nt_s)$, comprises:
   a sampling device; and
   a delay line that provides a time delay of ¼ of a cycle of the carrier frequency of received signal in series with the sampling device.

3. The demodulator according to claim 1 wherein the means for converting the received signal Y(t) into a first baseband signal $Y(nt_s)$ and the means for converting the received signal Y(t) into a second baseband signal $\hat{Y}(nt_s)$, comprises:
   first sampling device;
   second sampling device;
   a 90° quadrature hybrid circuit having a 0° phase shift output terminal, a 90° phase shift output terminal, and an input terminal for receiving the received signal Y(t);
   means for electrically connecting the 0° phase shift output terminal to the first sampling device; and
   means for electrically connecting the 90° phase shift output terminal to the second sampling device.

4. The demodulator according to claim 1 wherein the means for converting the received signal Y(t) into a first baseband signal $Y(nt_s)$ and the means for converting the received signal Y(t) into a second baseband signal $\hat{Y}(nt_s)$ comprises:
   first sample and hold device;
   second sample and hold device;
   means for providing a first sampling command signal having a period that is represented by the equation $\hat{t}_s = t_s + \frac{1}{4}f_c$ where $t_s$ is the time interval between sampling pulses and $f_c$ is the carrier frequency of the received signal to the first sample and hold device; and
   means for providing a second command signal having a period of $t_s$ to the second sample and hold circuit.

5. The demodulator according to claim 1 wherein the means for performing a Hilbert's transform on the second baseband signal $\hat{Y}(nt_s)$ to obtain a quadrature second baseband signal $\hat{Y}(nt_s)$, comprises:
   a multi-celled charge couple device having a single input terminal and each cell having an output terminal; and
   summing means including a summing amplifier means, a predetermined number of weighting devices, each weighing device being connected between the input of said summing amplifier means and the output terminal of a preselected cell such that all of the outputs of said charge couple device are assigned a predetermined weight and summed by said summing amplifier means.

6. The demodulator according to claim 1 wherein the means for performing a Hilbert's transform on the second baseband signal $\hat{Y}(nt_s)$ to obtain a quadrature second baseband $\hat{Y}(nt_s)$ comprises:

analog to digital converter connected in series with the means for converting the received signal Y(t) into a second baseband signal $\hat{Y}(nt_s)$;

shift register means having an input terminal connected in series with the analog to digital converter and a plurality of stages, each stage having an output terminal; and summing means including a summing amplifier means, a predetermined number of weighting devices, each weighting device being connected between the input of said summing amplifier means and the output terminal of a preselected stage such that all of the outputs of the plurality of stages of said shift register means are assigned a predetermined weight and summed by said summing amplifier means.

7. In combination, a single sideband radio receiver for receiving a signal that can be represented by the equation $Y(t) = X(t) \cos(\omega_c t + \phi) \mp \hat{X}(t) \sin(\omega_c t + \phi)$ where $\omega_c$ is the carrier frequency and $\phi$ is a constant phase shift including, in cascade arrangement, an antenna, a filter and RF amplifier means, a mixer means, IF filter and amplifier means, a single sideband demodulator means, and a local oscillator means connected to said mixer means, wherein said single sideband demodulator means, comprises:

means for converting the received signal Y(t) into a first baseband signal $Y(nt_s)$ where n is an integer variable and $t_s$ is an sampling period;

means for converting the received signal Y(t) into a second baseband signal $\hat{Y}(nt_s)$; where n is an integer variable and $t_s$ is an sampling period;

means for performing a Hilbert's transform on the second baseband signal $\hat{Y}(nt_s)$ to obtain a quadrature second baseband signal $\hat{Y}(nt_s)$;

means for adding the first baseband signal $Y(nt_s)$ to the quadrature second baseband signal $\hat{Y}(nt_s)$ to obtain an lower sideband signal; and means for subtracting the quadrature second baseband signal $\hat{Y}(nt_s)$ from the first baseband signal $Y(nt_s)$ to obtain an upper sideband signal.

8. The combination according to claim 7 wherein the means for converting the received signal Y(t) into a second baseband signal $\hat{Y}(nt_s)$ comprises:

a sampling device; and a delay line that provides a time delay of ¼ of a cycle of the carrier frequency of received signal in series with the sampling device.

9. The combination according to claim 7 wherein the means for converting the received signal Y(t) into a first baseband signal $Y(nt_s)$ and the means for converting the received signal Y(t) into a second baseband signal $\hat{Y}(nt_s)$, comprises:

first sampling device;
second sampling device;
a 90° quadrature hybrid circuit having a 0° phase shift output terminal, a 90° phase shift output terminal and an input terminal for receiving the received signal Y(t);

means for connecting the 0° phase shift output terminal to the first sampling device; and means for connecting the 90° phase shift output terminal to the second sampling device.

10. The combination according to claim 7 wherein the means for converting the received signal Y(t) into a first baseband signal $Y(nt_s)$ and the means for converting the received signal Y(t) into a second baseband signal $\hat{Y}(nt_s)$, comprises:

first sample and hold device;
second sample and hold device;
means for providing a first sampling command signal having a period that is represented by the equation $\hat{t}_s = t_s + \frac{1}{4} f_c$ where $t_s$ is the time interval between sampling pulses and $f_c$ is the carrier frequency of the received signal to the first sample and hold device; and means for providing a second sample command signal having a period of $t_s$ to the second sample and hold circuit.

11. The combination according to claim 7 wherein the means for performing a Hilbert's transform on the second baseband signal $\hat{Y}(nt_s)$ to obtain a quadrature second baseband signal $\hat{Y}(nt_s)$ comprises:

a multi-celled charge couple device having a single input terminal and each cell having an output terminal; and summing means including a summing amplifier means, a predetermined number of weighting devices, each weighting device being connected between the input of said summing amplifier means and the output terminal of a preselected cell such that all of the outputs of said charge couple device are assigned a predetermined weight and summed by said summing amplifier means.

12. The combination according to claim 7 wherein the means for performing a Hilbert's transform on the second baseband $\hat{Y}(t)$ to obtain a quadrature second baseband signal $\hat{Y}(nt_s)$ comprises:

analog to digital converter connected in series with the means for converting the received signal Y(t) into a second baseband signal $\hat{Y}(nt_s)$;

shift register means having an input terminal connected in series with the analog to digital converter and a plurality of stages, each stage having an output terminal; and summing means including a summing amplifier means, a predetermined number of weighting devices, each weighting device being connected between the input of said summing amplifier means and the output terminal of a preselected stage, such that all of the outputs of the plurality of stages of said shift register means are assigned a predetermined weight and summed by said amplifier means.

13. A method for demodulating a signal that can be represented by the equation $Y(t) = X(t) \cos(\omega_c t + \phi) \mp \hat{X}(t) \sin(\omega_c t + \phi)$ where $\omega_c$ is the carrier frequency and $\phi$ is a constant phase shift, comprising:

converting the received signal y(t) into a first baseband signal $Y(nt_s)$ where n is an integer variable and $t_s$ is an sampling period;

converting the received signal Y(t) into a second baseband signal $\hat{Y}(nt_s)$; where n is an integer variable and $t_s$ is an sampling period;

performing a Hilbert's transform on the second baseband signal $\hat{Y}(nt_s)$ to obtain a quadrature second baseband signal $\hat{Y}(nt_s)$;

adding the first baseband signal $Y(nt_s)$ to the quadrature second baseband signal $\hat{Y}(nt_s)$ to obtain an lower sideband signal; and subtracting the quadrature second baseband signal, $\hat{Y}(nt_s)$ from the first baseband signal $Y(nt_s)$ to obtain an upper sideband signal.

* * * * *